(12) United States Patent
Sekine et al.

(10) Patent No.: US 12,142,623 B2
(45) Date of Patent: Nov. 12, 2024

(54) PHOTOELECTRIC CONVERSION DEVICE HAVING A SUBSTRATE WITH PIXELS EACH INCLUDING A PHOTOELECTRIC CONVERTER, A CHARGE HOLDING PORTION, AND AN AMPLIFIER UNIT

(71) Applicant: CANON KABUSHIKI KAISHA, Tokyo (JP)

(72) Inventors: Hiroshi Sekine, Kanagawa (JP); Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 238 days.

(21) Appl. No.: 17/858,098

(22) Filed: Jul. 6, 2022

(65) Prior Publication Data

US 2023/0038959 A1 Feb. 9, 2023

(30) Foreign Application Priority Data

Aug. 4, 2021 (JP) .................................. 2021-128520

(51) Int. Cl.
    *H01L 27/146*     (2006.01)
    *G06T 7/55*     (2017.01)
    *H04N 25/77*     (2023.01)

(52) U.S. Cl.
    CPC .......... *H01L 27/14623* (2013.01); *G06T 7/55* (2017.01); *H01L 27/14612* (2013.01); *H04N 25/77* (2023.01); *G06T 2207/30252* (2013.01)

(58) Field of Classification Search
    CPC ........ H01L 27/14623; H01L 27/14612; H04N 25/77; G06T 7/55
See application file for complete search history.

(56) References Cited

U.S. PATENT DOCUMENTS

| | | | |
|---|---|---|---|
| 4,962,412 A | 10/1990 | Shinohara |
| 5,008,206 A | 4/1991 | Shinohara |
| 5,060,042 A | 10/1991 | Shinohara |
| 5,086,326 A | 2/1992 | Shinohara |
| 5,146,339 A | 9/1992 | Shinohara |

(Continued)

FOREIGN PATENT DOCUMENTS

JP      2018-92976 A      6/2018

OTHER PUBLICATIONS

U.S. Appl. No. 17/886,552, filed Aug. 12, 2022 by Daiki Shirahige (Pending).

*Primary Examiner* — Nicholas G Giles
(74) *Attorney, Agent, or Firm* — VENABLE LLP

(57) ABSTRACT

A photoelectric conversion device includes a substrate provided with pixels each including a photoelectric converter that accumulates charge generated by an incidence of light, a charge holding portion that holds charge transferred from the photoelectric converter, and an amplifier unit that includes an input node that receives charge transferred from the charge holding portion, a metal film disposed over a side of a first surface of the substrate so as to cover at least the charge holding portion, and a trench structure provided in the substrate on the side of the first surface of the substrate. The photoelectric conversion device is configured such that the light is incident from the side of the first surface of the substrate. The trench structure is disposed between the photoelectric converter and the charge holding portion of a first pixel.

20 Claims, 11 Drawing Sheets

(56) References Cited

U.S. PATENT DOCUMENTS

| | | | |
|---|---|---|---|
| 5,280,358 A | 1/1994 | Yushiya | |
| 6,828,601 B2 | 12/2004 | Shinohara | |
| 6,876,019 B2 | 4/2005 | Shinohara | |
| 7,250,970 B2 | 7/2007 | Shinohara | |
| 7,394,492 B2 | 7/2008 | Shinohara | |
| 7,741,593 B2 | 6/2010 | Iwata | |
| 7,821,551 B2 | 10/2010 | Shinohara | |
| 7,884,870 B2 | 2/2011 | Shinohara | |
| 8,063,966 B2 | 11/2011 | Shinohara | |
| 8,139,133 B2 | 3/2012 | Iwane | |
| 8,164,668 B2 | 4/2012 | Iida | |
| 8,345,137 B2 | 1/2013 | Shinohara | |
| 8,350,942 B2 | 1/2013 | Shinohara | |
| 8,471,942 B2 | 6/2013 | Shinohara | |
| 8,896,734 B2 | 11/2014 | Shinohara | |
| 8,970,769 B2 | 3/2015 | Shinohara | |
| 9,437,647 B2 | 9/2016 | Shinohara | |
| 10,009,560 B2 | 6/2018 | Kobayashi | |
| 10,186,532 B2 | 1/2019 | Kobayashi | |
| 10,205,894 B2 | 2/2019 | Kawabata | |
| 10,483,307 B2 | 11/2019 | Sekine | |
| 10,535,688 B2 | 1/2020 | Onuki | |
| 10,645,322 B2 | 5/2020 | Sekine | |
| 10,714,515 B2 | 7/2020 | Shinohara | |
| 10,771,718 B2 | 9/2020 | Kawabata | |
| 10,771,720 B2 | 9/2020 | Shinohara | |
| 10,805,563 B2 | 10/2020 | Ikeda | |
| 10,818,724 B2 | 10/2020 | Shinohara | |
| 10,848,695 B2 | 11/2020 | Miki | |
| 10,944,931 B2 | 3/2021 | Shinohara | |
| 11,056,520 B2 | 7/2021 | Onuki | |
| 11,297,273 B2 | 4/2022 | Sekine | |
| 2005/0253946 A1 | 11/2005 | Shinohara | |
| 2016/0071893 A1 | 3/2016 | Shinohara | |
| 2019/0333951 A1 | 10/2019 | Neya | |
| 2020/0275039 A1 | 8/2020 | Shinohara | |
| 2020/0321376 A1* | 10/2020 | Noudo | H01L 27/14603 |
| 2020/0366858 A1 | 11/2020 | Shinohara | |
| 2021/0266476 A1 | 8/2021 | Kumagai et al. | |
| 2022/0037380 A1 | 2/2022 | Shinohara | |
| 2022/0093662 A1 | 3/2022 | Shinohara | |
| 2022/0103775 A1 | 3/2022 | Kumagai et al. | |

* cited by examiner

PHOTOELECTRIC CONVERSION DEVICE HAVING A SUBSTRATE WITH PIXELS EACH INCLUDING A PHOTOELECTRIC CONVERTER, A CHARGE HOLDING PORTION, AND AN AMPLIFIER UNIT

BACKGROUND OF THE INVENTION

Field of the Invention

The present invention relates to a photoelectric conversion device.

Description of the Related Art

As an imaging device mounted in an imaging system such as a digital still camera, a digital video camera, and the like, a CMOS image sensor which consumes less power and can perform high-speed readout is widely used. In recent years, in a CMOS image sensor, it has been proposed to perform imaging in an operation mode called a global electronic shutter. The global electronic shutter operation is a driving method in which imaging is performed so that exposure periods of a plurality of pixels coincide with each other, and there is an advantage in that an object image is less likely to be distorted even when an object with high motion is photographed.

Japanese Patent Application Laid-Open No. 2018-092976 discloses a pixel provided with, in addition to a photoelectric converter that performs photoelectric conversion, a charge holding portion that holds charge generated in the photoelectric converter for a predetermined period in order to realize a function of a global electronic shutter. In such a pixel configuration, when light is incident on the charge holding portion, charge photoelectrically converted by the charge holding portion become a false signal, which may cause degradation of image quality. Therefore, the imaging device described in Japanese Patent Application Laid-Open No. 2018-092976 is provided with a light shielding portion that covers the charge holding portion.

However, in the imaging device described in Japanese Patent Application Laid-Open No. 2018-092976, in order to guide light to the photoelectric converter, an opening provided in the light shielding unit is disposed in the vicinity of the charge holding portion, and the light shielding of the charge holding portion may not be sufficient. For this reason, a false signal may be generated by the light leaked into the charge holding portion, and the image quality may be degraded.

SUMMARY OF THE INVENTION

An object of the present invention is to provide a photoelectric conversion device capable of reducing degradation of image quality due to a false signal.

According to an embodiment of the present disclosure, there is provided a photoelectric conversion device including a substrate provided with pixels each including a photoelectric converter that accumulates charge generated by an incidence of light, a charge holding portion that holds charge transferred from the photoelectric converter, and an amplifier unit that includes an input node that receives charge transferred from the charge holding portion, a metal film disposed over a side of a first surface of the substrate so as to cover at least the charge holding portion, and a trench structure disposed in the substrate on the side of the first surface, wherein the photoelectric conversion device is configured such that the light is incident from the side of the first surface of the substrate, and wherein the trench structure is disposed between the photoelectric converter and the charge holding portion of a first pixel.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
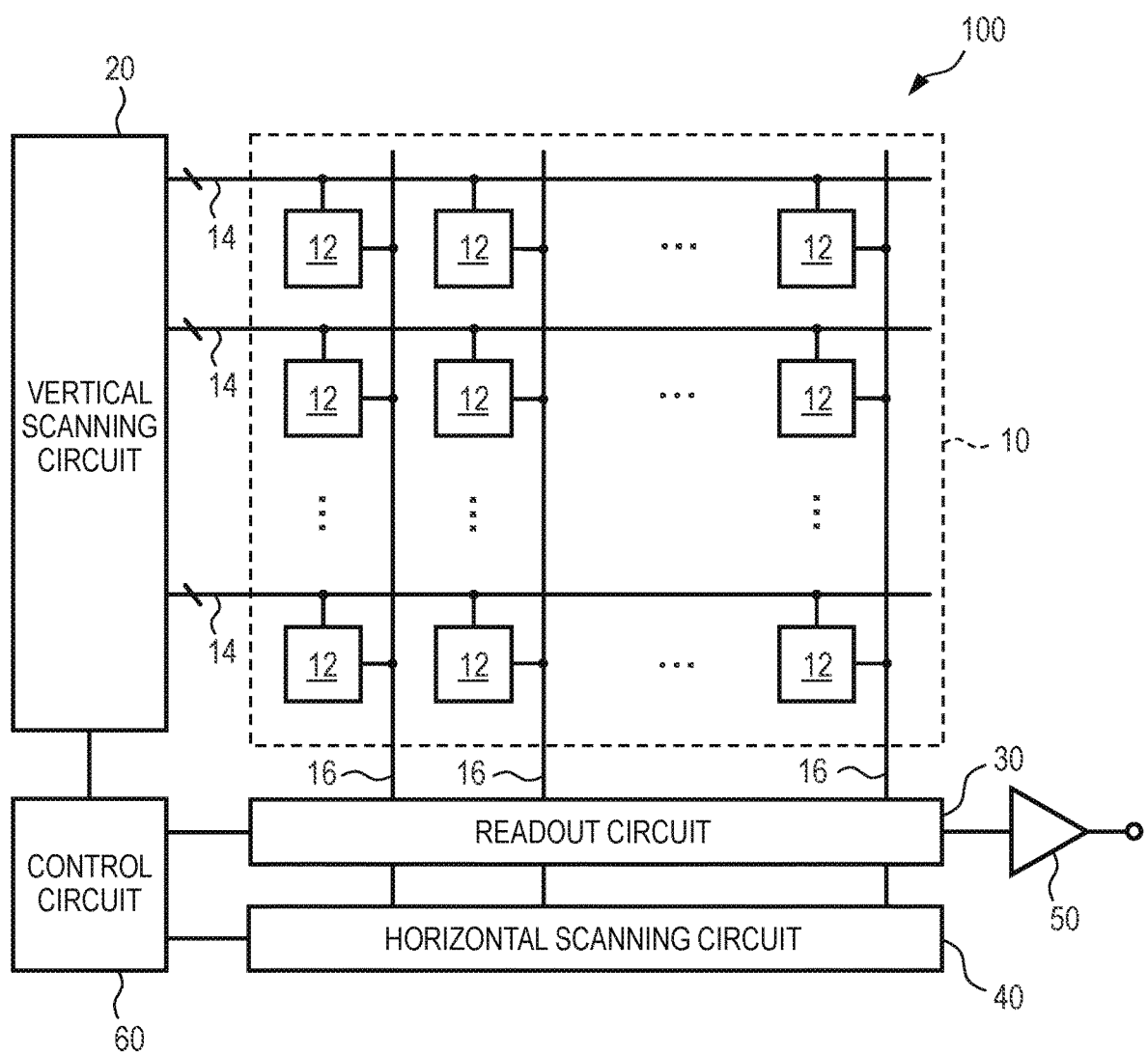
FIG. 1 is a block diagram illustrating a schematic configuration of a photoelectric conversion device according to a first embodiment of the present invention.
Figure 2:
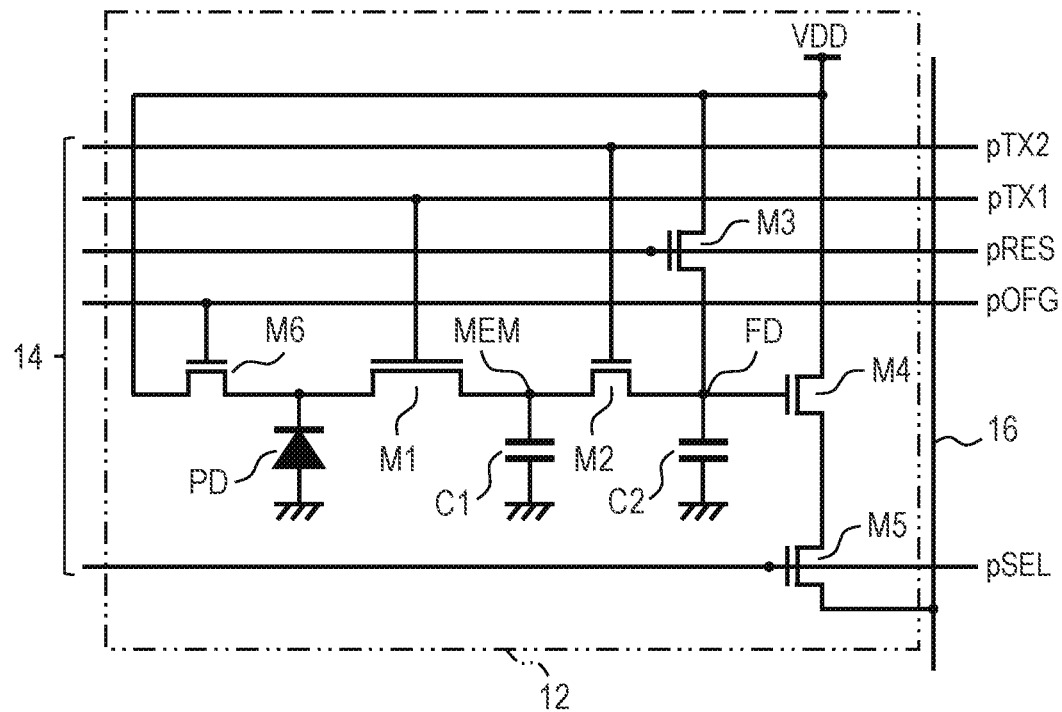
FIG. 2 is an equivalent circuit diagram of a pixel of the photoelectric conversion device according to the first embodiment of the present invention.
Figure 3:
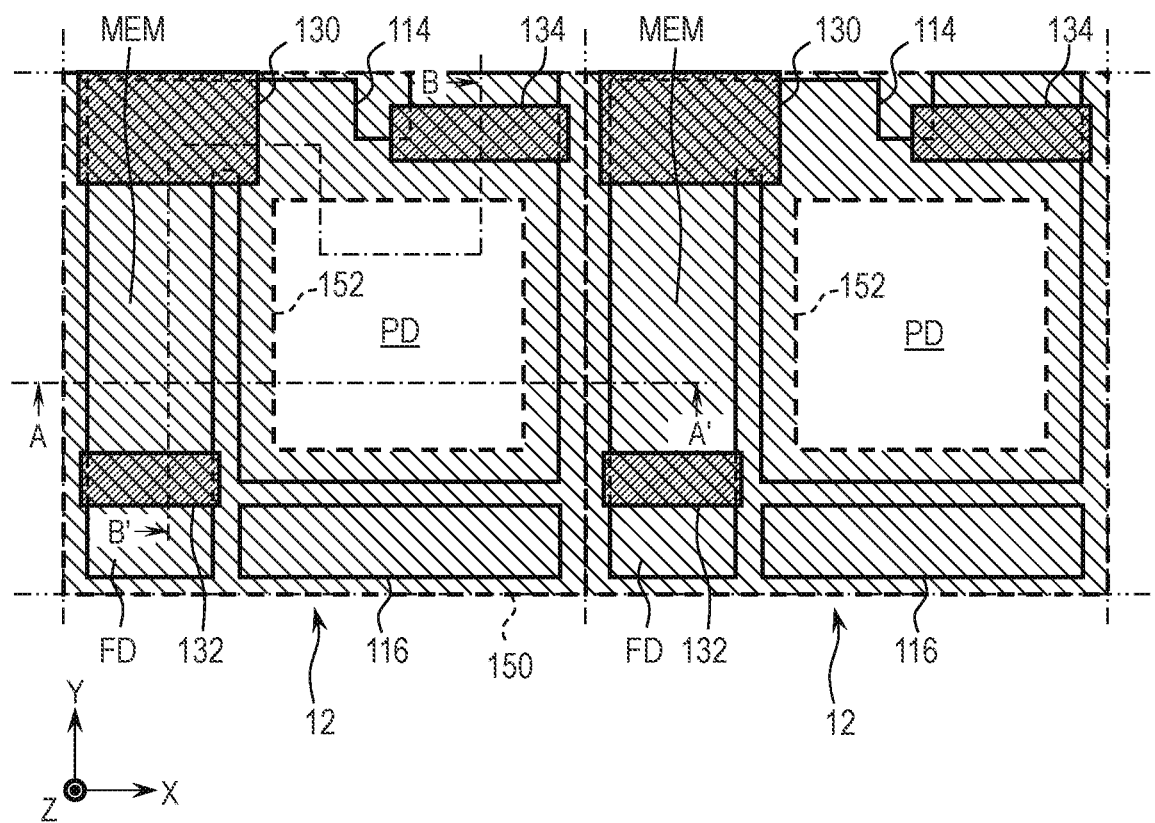
FIG. 3 is a plan view of the pixels of the photoelectric conversion device according to the first embodiment of the present invention.
Figure 4A:
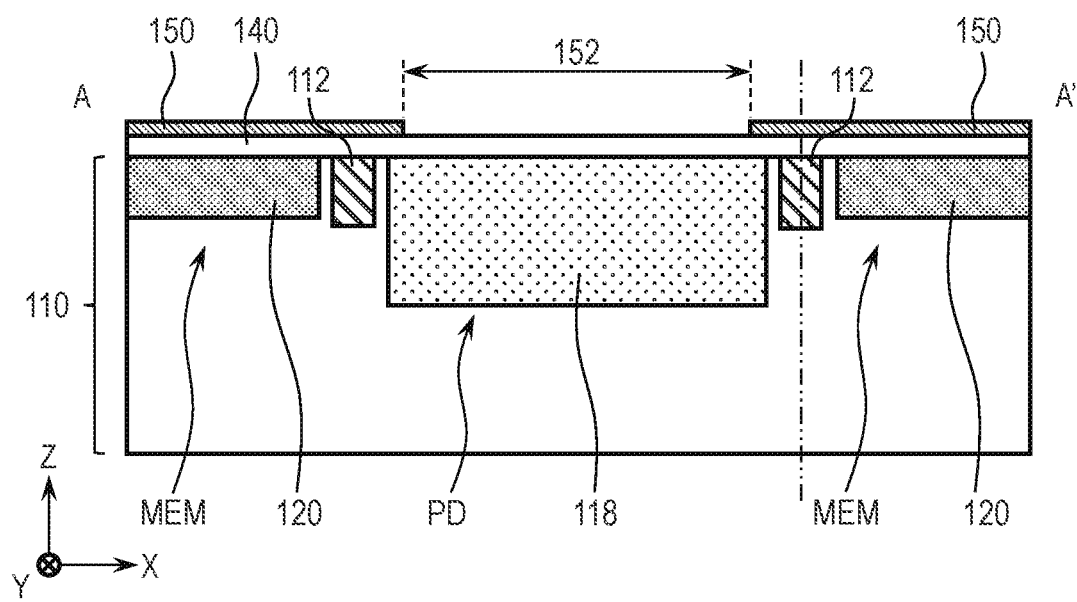
FIG. 4A and FIG. 4B are cross-sectional views of the pixels of the photoelectric conversion device according to the first embodiment of the present invention.
Figure 4B:
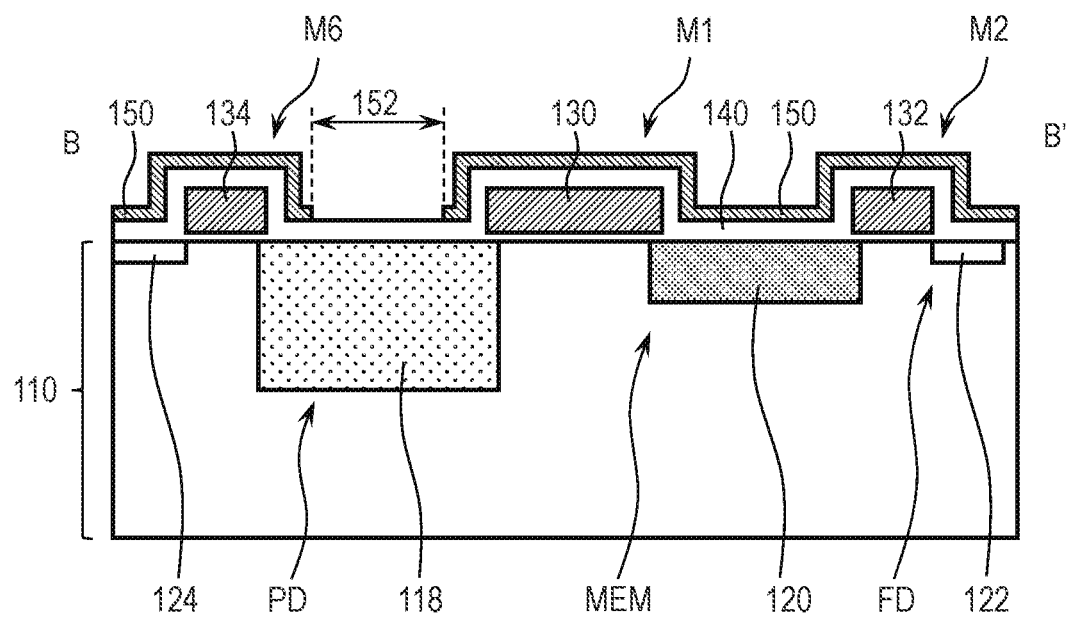

A photoelectric conversion device according to a first embodiment of the present invention will be described with reference to FIG. 1 to FIG. 4B. FIG. 1 is a block diagram illustrating a schematic configuration of a photoelectric conversion device according to the present embodiment. FIG. 2 is an equivalent circuit diagram of a pixel of the photoelectric conversion device according to the present embodiment. FIG. 3 is a plan view of the pixels of the photoelectric conversion device according to the present embodiment. FIG. 4A and FIG. 4B are cross-sectional views of the pixels of the photoelectric conversion device according to the present embodiment.

As illustrated in FIG. 1, the photoelectric conversion device according to the present embodiment may include a pixel array unit 10, a vertical scanning circuit 20, a readout circuit 30, a horizontal scanning circuit 40, an output circuit 50, and a control circuit 60. The photoelectric conversion device 100 is a semiconductor device formed on a semiconductor substrate such as a silicon substrate, and may be, for example, a CMOS image sensor.

The pixel array unit 10 is provided with a plurality of pixels 12 arranged in a matrix form over a plurality of rows and a plurality of columns. Each pixel 12 includes a photoelectric converter comprised of a photoelectric conversion element such as a photodiode, and outputs a pixel signal corresponding to an amount of incident light. The number of rows and columns of the pixel array arranged in the pixel array unit 10 is not particularly limited. In addition, in the pixel array unit 10, in addition to effective pixels which output pixel signals according to the amount of incident light, optical black pixels in which the photoelectric converters are shielded from light, dummy pixels which do not output signals, and the like may be arranged.

In each row of the pixel array unit 10, a control line 14 is arranged so as to extend in a first direction (lateral direction in FIG. 1). Each of the control lines 14 is connected to each of the pixels 12 arranged in the first direction on the corresponding row, and serves as a signal line common to these pixels 12. The first direction in which the control lines 14 extend may be referred to as a row direction or a horizontal direction. The control line 14 is connected to the vertical scanning circuit 20.

In each column of the pixel array unit 10, an output line 16 is arranged so as to extend in a second direction (vertical direction in FIG. 1) intersecting with the first direction. Each of the output lines 16 is connected to each of the pixels 12 arranged in the second direction on the corresponding column, and serves as a signal line common to these pixels 12. The second direction in which the output lines 16 extend may be referred to as a column direction or a vertical direction. The output line 16 is connected to the readout circuit 30.

The vertical scanning circuit 20 is a control circuit unit that supplies control signals for driving the pixels 12 to the pixels 12 via the control lines 14 provided in each row of the pixel array. The vertical scanning circuit 20 may be configured using a shift register or an address decoder. The vertical scanning circuit 20 drives the pixels 12 of the pixel array unit 10 in units of rows by the control signals supplied via the control lines 14. The signals read out from the pixels 12 in units of rows are input to the readout circuit 30 via the output lines 16 provided in each column of the pixel array unit 10.

The readout circuit 30 holds the pixel signals read out from the pixel array unit 10, and performs predetermined processing on the pixel signals, for example, signal processing such as correction processing by correlated double sampling, amplification processing, and analog/digital conversion processing. The readout circuit 30 includes a signal holding circuit configured to hold the pixel signals output from the pixel array unit 10.

The horizontal scanning circuit 40 is a circuit unit that supplies control signals for sequentially transferring the pixel signals processed by the readout circuit 30 to the output circuit 50 column by column to the readout circuit 30. The horizontal scanning circuit 40 may be configured using a shift register or an address decoder.

The output circuit 50 comprises a buffer amplifier, a differential amplifier, and the like, performs predetermined signal processing on the pixel signal of the column selected by the horizontal scanning circuit 40, and outputs the processed pixel data to the outside of the photoelectric conversion device 100. Examples of the signal processing performed by the output circuit 50 include correction processing by correlated double sampling, amplification processing, and the like.

The control circuit 60 is a circuit unit configured to supply control signals for controlling operations and timings of the vertical scanning circuit 20, the readout circuit 30, and the horizontal scanning circuit 40. A part or all of the control signals supplied to the vertical scanning circuit 20, the readout circuit 30, and the horizontal scanning circuit 40 may be supplied from the outside of the photoelectric conversion device 100.

Next, a configuration example of a pixel in the photoelectric conversion device according to the present embodiment will be described with reference to FIG. 2.

The pixel 12 may be a minimum unit of circuitry that is repeatedly arranged to construct an image. As illustrated in FIG. 2, for example, each of the pixels 12 may include a photoelectric converter PD, transfer transistors M1 and M2, a reset transistor M3, an amplifier transistor M4, a select transistor M5, and an overflow transistor M6. The transfer transistors M1 and M2, the reset transistor M3, the amplifier transistor M4, the select transistor M5, and the overflow transistor M6 may be formed of MOS transistors. Each pixel 12 may include a microlens and a color filter arranged on the optical path until incident light is guided to the photoelectric converter PD. The microlens collects incident light to the photoelectric converter PD. The color filter selectively transmits light of a predetermined color.

The photoelectric converter PD is, for example, a photodiode, an anode of which is connected to a ground node, and a cathode of which is connected to a source of the transfer transistor M1 and a source of the overflow transistor M6. A drain of the transfer transistor M1 is connected to a source of the transfer transistor M2. A capacitance component parasitically coupled to the connection node between the drain of the transfer transistor M1 and the source of the transfer transistor M2 functions as a charge holding portion MEM. In FIG. 2, this capacitance component is represented by a capacitor C1.

A drain of the transfer transistor M2 is connected to a source of the reset transistor M3 and a gate of the amplifier transistor M4. The connection node of the drain of the transfer transistor M2, the source of the reset transistor M3, and the gate of the amplifier transistor M4 is a so-called floating diffusion FD. A capacitance component (floating diffusion capacitance) parasitically coupled to the floating diffusion FD functions as a charge holding portion. In FIG. 2, this capacitance component is represented by a capacitor C2 connected to the floating diffusion FD.

A drain of the overflow transistor M6, a drain of the reset transistor M3, and a drain of the amplifier transistor M4 are connected to a power supply voltage node (voltage: VDD). At least two of the voltage supplied to the drain of the overflow transistor M6, the voltage supplied to the drain of the reset transistor M3, and the voltage supplied to the drain of the amplifier transistor M4 may be the same or different. A source of the amplifier transistor M4 is connected to a drain of the select transistor M5. The source of the select transistor M5 is connected to the output line 16.

In the case of the pixel configuration of FIG. 2, the control line 14 of each row includes five signal lines connected to gates of the transfer transistors M1 and M2, a gate of the reset transistor M3, a gate of the select transistor M5, and a gate of the overflow transistor M6. A control signal pTX1 is supplied from the vertical scanning circuit 20 to a signal line connected to the gate of the transfer transistor M1. A control signal pTX2 is supplied from the vertical scanning circuit 20 to a signal line connected to the gate of the transfer transistor M2. A control signal pRES is supplied from the vertical scanning circuit 20 to a signal line connected to the gate of the reset transistor M3. A control signal pOFG is supplied from the vertical scanning circuit 20 to a signal line connected to the gate of the overflow transistor M6. A control signal pSEL is supplied from the vertical scanning circuit 20 to a signal line connected to the gate of the select transistor M5. When each transistor is formed of an n-channel MOS transistor, when a high-level control signal is supplied from the vertical scanning circuit 20, the corresponding transistor is turned on. When a low-level control signal is supplied from the vertical scanning circuit 20, the corresponding transistor is turned off.

In the present embodiment, a description will be given assuming a case where electrons among electron-hole pairs generated in the photoelectric converter PD by light incidence are used as a signal charge. When electrons are used as the signal charge, each transistor included in the pixel 12 may be formed of an n-channel MOS transistor. However, the signal charge is not limited to electrons, and holes may be used as the signal charge. When holes are used as the signal charge, the conductivity types of the transistors and the semiconductor layers are opposite to those described in the present embodiment. In addition, the term "source" or "drain" of the MOS transistor may vary depending on the conductivity type of the transistor or the target function. Some or all of names of a source and a drain used in the present embodiment are sometimes referred to as reverse names.

The photoelectric converter PD converts (photoelectrically converts) incident light into charge of an amount corresponding to the amount of the incident light, and accumulates the generated charge. The overflow transistor M6 is controlled to be on-state by the control signal pOFG to discharge charge held in the photoelectric converter PD to the drain (power supply voltage node). That is, the overflow transistor M6 has a function of resetting the photoelectric converter PD.

The transfer transistor M1 is controlled to be on-state by the control signal pTX1 to transfer charge held by the photoelectric converter PD to the charge holding portion MEM. The charge holding portion MEM holds the charge transferred from the photoelectric converter PD. The transfer transistor M2 is controlled to be on-state by the control signal pTX2 to transfer the charge held by the charge holding portion MEM to the floating diffusion FD. The floating diffusion FD holds the charge transferred from the charge holding portion MEM, and sets a voltage of an input node (the gate of the amplifier transistor M4) of an amplifier unit to a voltage corresponding to the capacitance value (C2) and the amount of the transferred charge.

The reset transistor M3 is controlled to be on-state by the control signal pRES to reset the floating diffusion FD to a predetermined voltage corresponding to the voltage VDD. At this time, the charge holding portion MEM may be reset by turning on the transfer transistor M2. Further, by turning on the transfer transistor M1, the photoelectric converter PD may be reset.

The select transistor M5 is controlled to be on-state by the control signal pSEL so that the signal of the pixel 12 may be output to the output line 16 (selected state). The amplifier transistor M4 is configured such that a voltage VDD is supplied to the drain and a bias current is supplied from a current source (not illustrated) to the source via the select transistor M5, and constitutes an amplifier unit (source follower circuit) having the gate as an input node. Accordingly, the amplifier transistor M4 outputs a signal corresponding to the voltage of the floating diffusion FD to the output line 16 via the select transistor M5.

With this configuration, charge generated in the photoelectric converter PD while the charge holding portion MEM holds charge can be accumulated in the photoelectric converter PD. This makes it possible to perform an imaging operation in which exposure periods of the plurality of pixels 12 coincide with each other, that is, a so-called global electronic shutter operation. Note that an electronic shutter is to electrically control accumulation of charge generated by incident light.

FIG. 3 illustrates an example of a planar layout of two adjacent pixels 12. For simplicity, FIG. 3 illustrates only patterns of active regions 114 and 116, a gate electrode 130 of the transfer transistor Ml, a gate electrode 132 of the transfer transistor M2, a gate electrode 134 of the overflow transistor, and a light shielding portion 150. FIG. 4A is a cross-sectional view taken along the line A-A' of FIG. 3, and FIG. 4B is a cross-sectional view taken along the line B-B' of FIG. 3. The two-dot chain line illustrated in FIG. 3 and FIG. 4A represents a boundary between the adjacent pixels 12.

Active regions 114 and 116 are provided on a surface of a semiconductor substrate 110. In FIG. 3, the inside of solid lines denoted by reference numerals 114 and 116 is an active region, and the outside of the solid lines denoted by reference numerals 114 and 116 is a field region. In the active region 114, among the components of the pixel 12, a photoelectric converter PD, transfer transistors M1 and M2, an overflow transistor M6, a charge holding portion MEM, and a floating diffusion FD are provided. In the active region 116, among the components of the pixel 12, a reset transistor M3, an amplifier transistor M4 and a select transistor M5 are provided.

As illustrated in FIG. 3, each of the gate electrodes 130, 132, and 134 is arranged to traverse the active region 114 in a plan view. In the plan view, the photoelectric converter PD is positioned on one side of the active region 114 adjacent to the gate electrode 130, and the charge holding portion MEM is positioned on the other side of the active region 114 adjacent to the gate electrode 130. In the plan view, the charge holding portion MEM is positioned on one side of the active region 114 adjacent to the gate electrode 132, and the floating diffusion FD is positioned on the other side of the active region 114 adjacent to the gate electrode 132. In addition, in the plan view, the photoelectric converter PD is positioned on one side of the active region 114 adjacent to the gate electrode 134, and the drain of the overflow transistor M6 is positioned on the other side of the active region 114 adjacent to the gate electrode 134.

The charge holding portion MEM and the photoelectric converter PD of one pixel 12 are arranged side by side in the first direction (X direction) in the plan view. The photoelectric converter PD of one pixel 12 (the pixel 12 on the left side in FIG. 3) and the charge holding portion MEM of the other pixel 12 (the pixel 12 on the right side in FIG. 3) arranged adjacent to the one pixel 12 in the first direction are arranged side by side in the first direction (the X direction). The gate electrode 130 of the transfer transistor M1 is disposed in a second direction (Y direction) intersecting the first direction with respect to the charge holding portion MEM.

Although not particularly limited, the floating diffusion FD and the charge holding portion MEM of one pixel 12 are arranged side by side in the second direction (Y direction) intersecting the first direction in the plan view. Although not particularly limited, the photoelectric converter PD and the drain of the overflow transistor M6 of one pixel 12 are arranged side by side in the second direction (Y direction) in the plan view. Although not particularly limited, the active region 116 and the photoelectric converter PD of one pixel 12 are arranged side by side in the second direction (Y direction) in the plan view.

In this specification, a plan view means a top view from a direction perpendicular to the surface of the semiconductor substrate 110, and corresponds to the plan view of FIG. 3 and the like.

As illustrated in FIG. 4A and FIG. 4B, the photoelectric converter PD includes an n-type semiconductor region 118 as a charge accumulation layer for accumulating charge generated by photoelectric conversion. The n-type semiconductor region 118 may also function as the source of the transfer transistor M1 and the source of the overflow transistor M6. The charge holding portion MEM includes an n-type semiconductor region 120 as a charge holding layer for holding charge transferred from the photoelectric converter PD. The n-type semiconductor region 120 may also function as the drain of the transfer transistor M1 and the source of the transfer transistor M2. The floating diffusion FD includes an n-type semiconductor region 122 as a charge holding layer for holding charge transferred from the charge holding portion MEM. The n-type semiconductor region 122 may also function as the drain of the transfer transistor M2. The overflow transistor M6 includes an n-type semiconductor region 124. The n-type semiconductor region 124 may function as the drain of the overflow transistor M6.

An insulating film 140 is provided over the semiconductor substrate 110 provided with the transfer transistors M1 and M2, the charge holding portion MEM, the floating diffusion FD, the overflow transistor M6, and the like. Over the insulating film 140, a light shielding layer (light shielding portion 150), which covers at least the entire charge holding portion MEM and has an opening 152 at a portion overlapping at least a part of the n-type semiconductor region 118 in the plan view, is provided. The light shielding portion 150 is for preventing light from entering the charge holding portion MEM, and may be formed of a metal film made of a material which is difficult to transmit light, for example, a metal material such as aluminum. This is because, when light is incident on the charge holding portion MEM and electric charge are generated by photoelectric conversion, the electric charge becomes a false signal, resulting in deterioration of image quality.

A transfer path through which the charge is transferred from the photoelectric converter PD to the charge holding portion MEM is disposed on the side of the opening 152 in the second direction (Y direction) intersecting the first direction (X direction) in which the photoelectric converter PD and the charge holding portion MEM are arranged.

As described above, in the photoelectric conversion device 100 of the present embodiment, the photoelectric converter PD and the charge holding portion MEM of one pixel are disposed adjacent to each other with the field region interposed therebetween. The photoelectric converter PD and the charge holding portion MEM of the adjacent pixels 12 are disposed adjacent to each other with the field region interposed therebetween. When the photoelectric converter PD and the charge holding portion MEM are in such a positional relationship, a part of the light incident on the pixel 12 through the opening 152 may leak into the charge holding portion MEM, and the charge that causes a false signal may be generated by photoelectric conversion in the charge holding portion MEM.

Therefore, in the photoelectric conversion device 100 of the present embodiment, a light shielding portion 112 is provided in the field region between the photoelectric converter PD and the charge holding portion MEM of one pixel 12 and between the photoelectric converter PD and the charge holding portion MEM of the adjacent pixels 12. The light shielding portion 112 may be disposed in a region except a transfer path through which the charge is transferred from the photoelectric converter PD to the charge holding portion MEM in the region between the photoelectric converter PD and the charge holding portion MEM. The light shielding portion 112 may be made of a material, which is difficult to transmit light, for example, an insulating material such as silicon oxide or a metal material such as tungsten.

By providing the light shielding portion 112, light incident in a direction from the photoelectric converter PD side to the charge holding portion MEM side may be reduced. From such a viewpoint, the light shielding portion 112 is desirably formed deeper in the semiconductor substrate 110, and is preferably formed deeper than at least the n-type semiconductor region 120 constituting the charge holding portion MEM.

The light shielding portion 112 may be a trench structure formed by, for example, STI (Shallow Trench Isolation) method. When the light shielding portion 112 is formed of an insulating material, a manufacturing process similar to that of a normal element isolation insulating film may be applied. In the case where the light shielding portion 112 is made of a metal material, a part of the member buried in the element isolation trench may be replaced with a metal material in a normal manufacturing process of the element isolation insulating film.

In the case where the light shielding portion 112 is made of only an insulating material, some of the incident light may pass through the light shielding portion 112 depending on the insulating material, but the light incident on the charge holding portion MEM is reduced by reflection or refraction at the interface between the light shielding portion 112 and the semiconductor substrate 110. In this sense, it can be said that the light shielding portion 112 is a structure having a function of reducing the amount of light incident on the charge holding portion MEM from the side of the photoelectric converter PD as compared with the case where the light shielding portion 112 is not provided.

Thus, according to the present embodiment, since the light shielding portion 112 is provided inside the semiconductor substrate 110 between the photoelectric converter PD and the charge holding portion MEM, it is possible to reduce light incident in a direction from the photoelectric converter PD side toward the charge holding portion MEM side. Thereby, generation of charge that causes a false signal in the charge holding portion MEM may be reduced, and degradation of image quality may be reduced.

Second Embodiment

Figure 5:
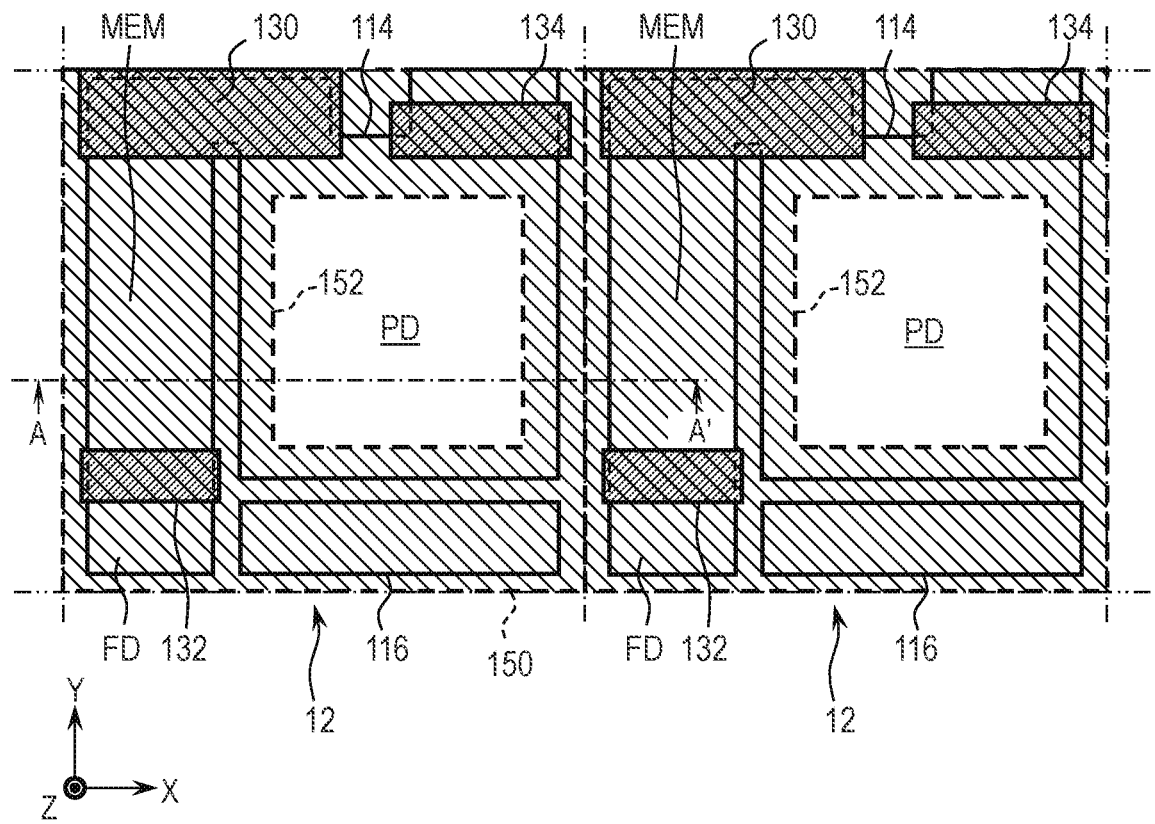
FIG. 5 is a plan view of pixels of a photoelectric conversion device according to a second embodiment of the present invention.
Figure 6:
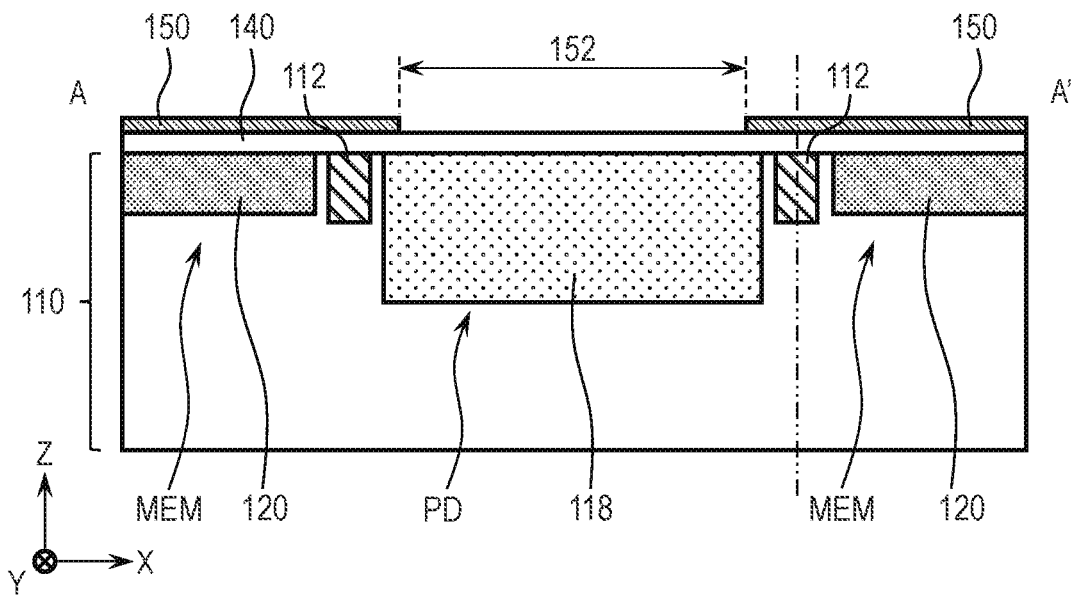
FIG. 6 is a cross-sectional view of the pixels of a photoelectric conversion device according to the second embodiment of the present invention.

A photoelectric conversion device according to a second embodiment of the present invention will be described with reference to FIG. 5 and FIG. 6. FIG. 5 is a plan view of pixels of the photoelectric conversion device according to the present embodiment. FIG. 6 is a cross-sectional view of the pixels of the photoelectric conversion device according to the present embodiment, and corresponds to a cross-sectional view taken along a line A-A' of FIG. 5. Components similar to those of the photoelectric conversion device according to the first embodiment are denoted by the same reference numerals, and description thereof will be omitted or simplified.

The photoelectric conversion device according to the present embodiment is the same as the photoelectric conversion device according to the first embodiment except that the planar layout of the transfer transistor M1 is different as illustrated in FIG. 5. That is, in the photoelectric conversion device of the first embodiment, the side of the gate electrode 130 facing the photoelectric converter PD is parallel to the Y direction, whereas in the photoelectric conversion device of the present embodiment, the side of the gate electrode 130 facing the photoelectric converter PD is parallel to the X direction.

Also in the layout of the present embodiment, as illustrated in FIG. 6, a light shielding portion 112 may be provided in a field region between the photoelectric converter PD and the charge holding portion MEM of one pixel 12 and between the photoelectric converter PD and the charge holding portion MEM of the adjacent pixels 12. This makes it possible to reduce light incident in a direction from the photoelectric converter PD side to the charge holding portion MEM side.

Thus, according to the present embodiment, since the light shielding portion 112 is provided inside the semiconductor substrate 110 between the photoelectric converter PD and the charge holding portion MEM, it is possible to reduce light incident in a direction from the photoelectric converter PD side toward the charge holding portion MEM side. Thereby, generation of charge that causes a false signal in the charge holding portion MEM may be reduced, and degradation of image quality may be reduced.

Third Embodiment

Figure 7:
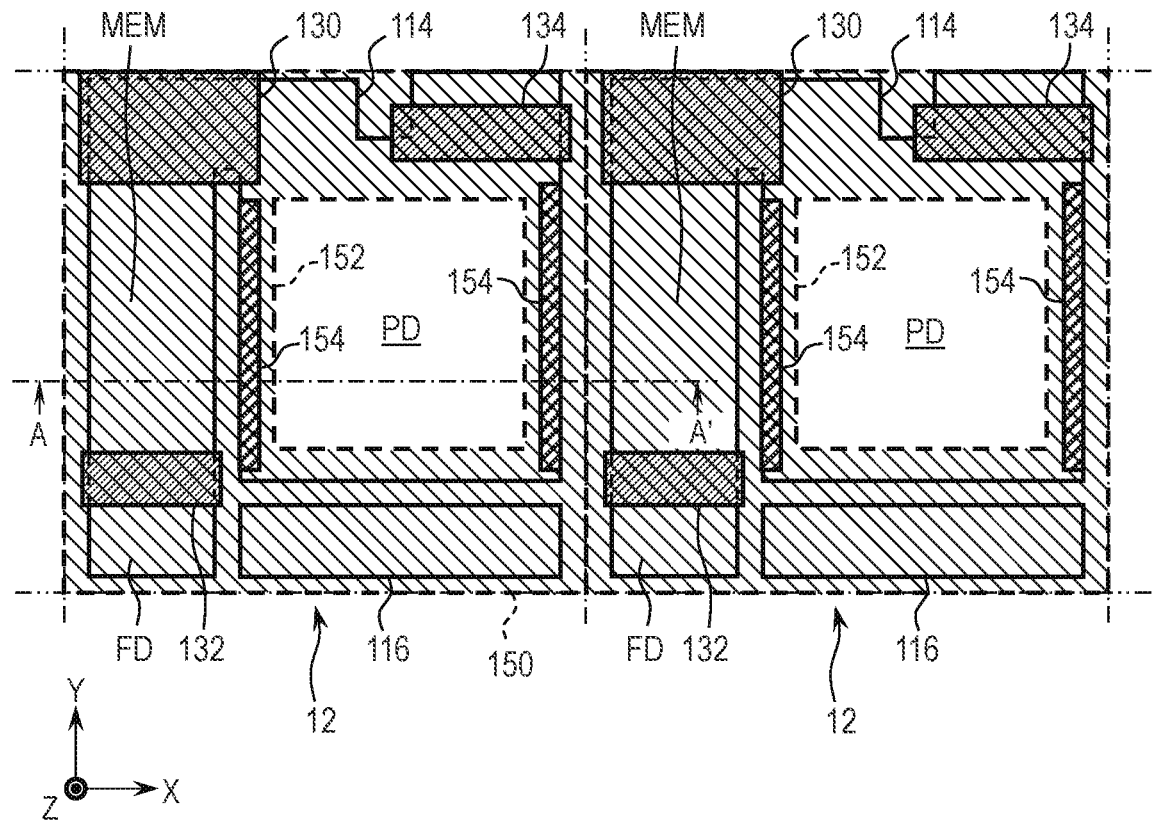
FIG. 7 is a plan view of pixels of a photoelectric conversion device according to a third embodiment of the present invention.
Figure 8:
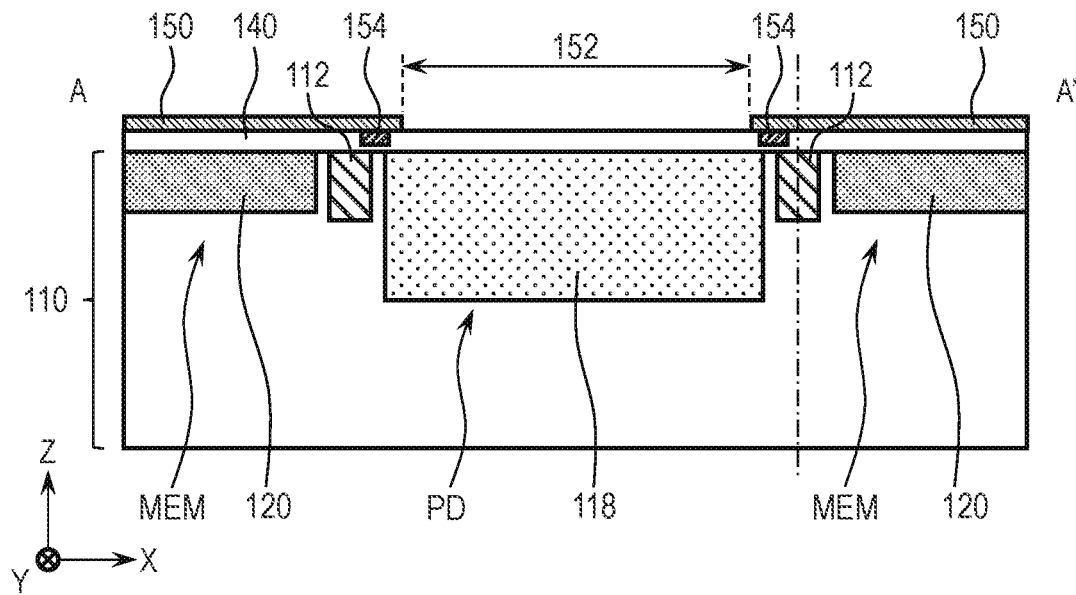
FIG. 8 is a cross-sectional view of the pixels of a photoelectric conversion device according to a third embodiment of the present invention.

A photoelectric conversion device according to a third embodiment of the present invention will be described with reference to FIG. 7 and FIG. 8. FIG. 7 is a plan view of pixels of the photoelectric conversion device according to the present embodiment. FIG. 8 is a cross-sectional view of the pixels of the photoelectric conversion device according to the present embodiment, and corresponds to a cross-sectional view taken along a line A-A' of FIG. 7. Components similar to those of the photoelectric conversion devices according to the first and second embodiments are denoted by the same reference numerals, and description thereof will be omitted or simplified.

As illustrated in FIG. 7 and FIG. 8, the photoelectric conversion device according to the present embodiment is different from the photoelectric conversion devices according to the first and second embodiments in that the photoelectric conversion device further includes a light shielding portion 154. The light shielding portion 154 is provided in the light shielding portion 150 and the semiconductor substrate 110 in a region between the photoelectric converter PD and the charge holding portion MEM of one pixel 12 and in a region between the photoelectric converter PD and the charge holding portion MEM of the adjacent pixels 12 in the plan view. Although FIG. 8 illustrates an example in which the light shielding portion 154 is provided in a region from the interface between the insulating film 140 and the light shielding portion 150 to the middle of the insulating film 140, the light shielding portion 154 may be in contact with or extend into the semiconductor substrate 110. The light shielding portion 154 may be a metal member provided at the position.

By providing the light shielding portion 154, light incident from the opening 152 and reflected by the surface of the semiconductor substrate 110 may be prevented from propagating through the insulating film 140 between the semiconductor substrate 110 and the light shielding portion 150 and entering the charge holding portion MEM.

Thus, according to the present embodiment, since the light shielding portion 154 is further provided below the light shielding portion 150 between the photoelectric converter PD and the charge holding portion MEM, it is possible to further reduce the light incident in the direction from the photoelectric converter PD side toward the charge holding portion MEM side. Thereby, generation of charge that causes a false signal in the charge holding portion MEM may be reduced, and degradation of image quality may be reduced.

Fourth Embodiment

Figure 9:
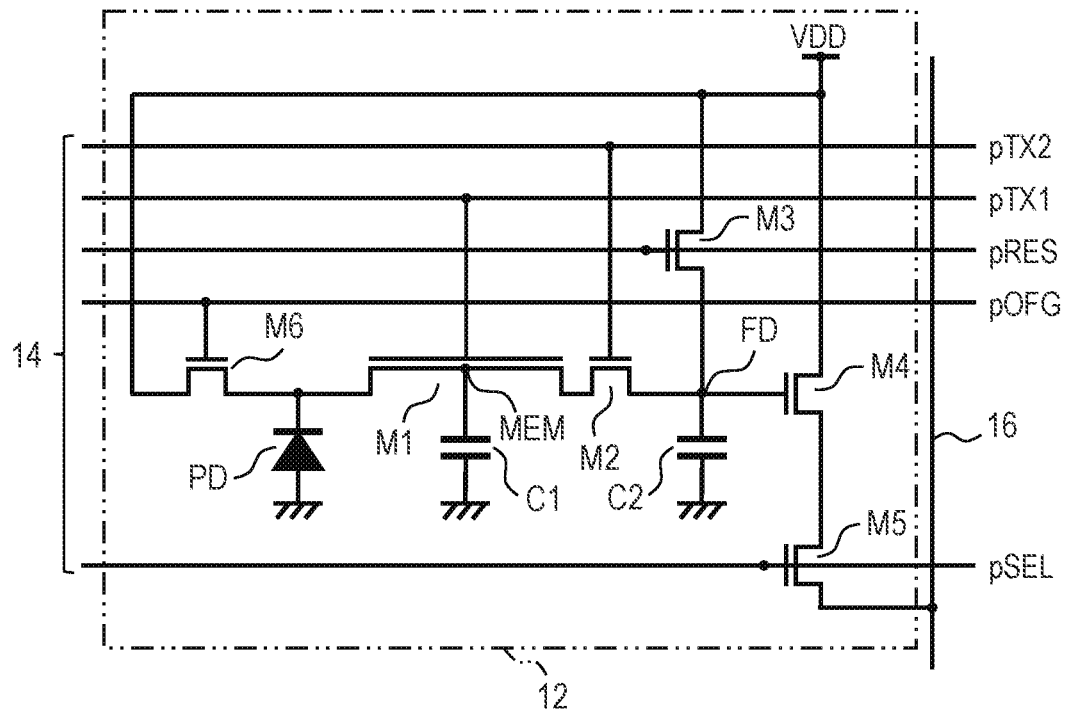
FIG. 9 is an equivalent circuit diagram of a pixel of a photoelectric conversion device according to a fourth embodiment of the present invention.
Figure 10:
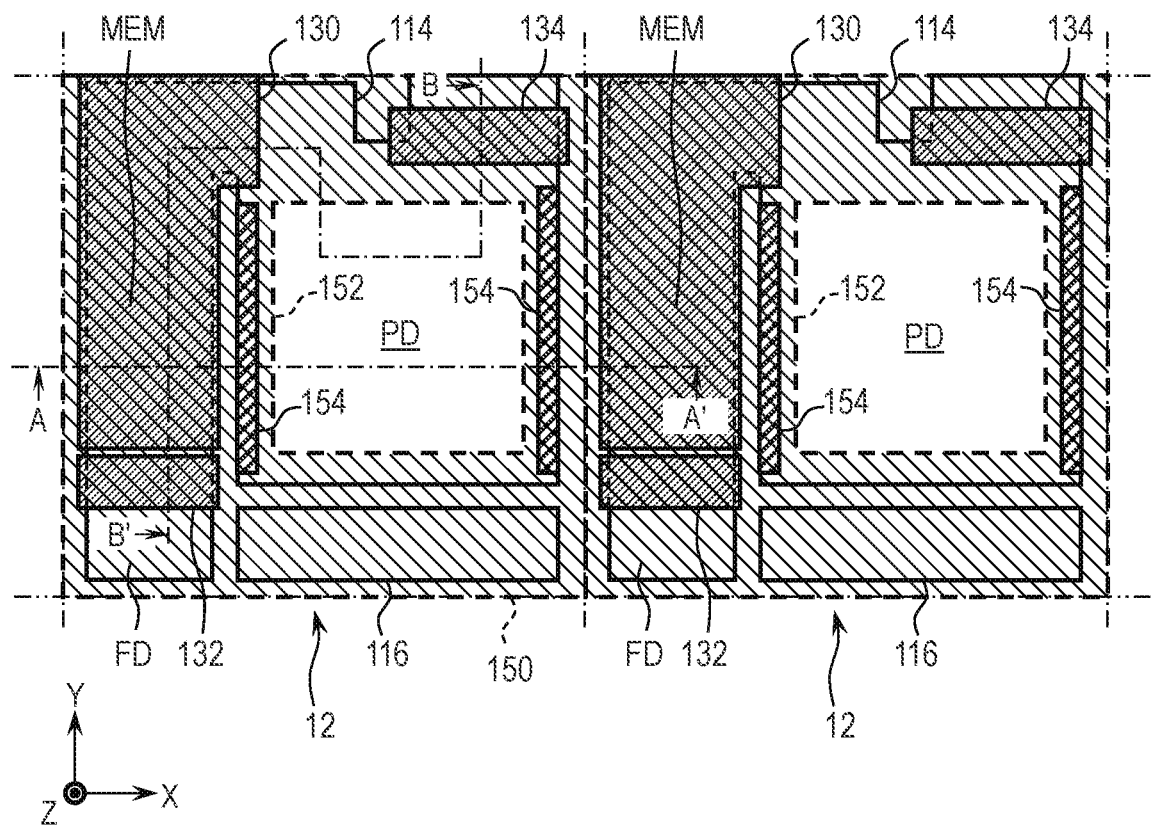
FIG. 10 is a plan view of the pixels of a photoelectric conversion device according to the fourth embodiment of the present invention.
Figure 11A:
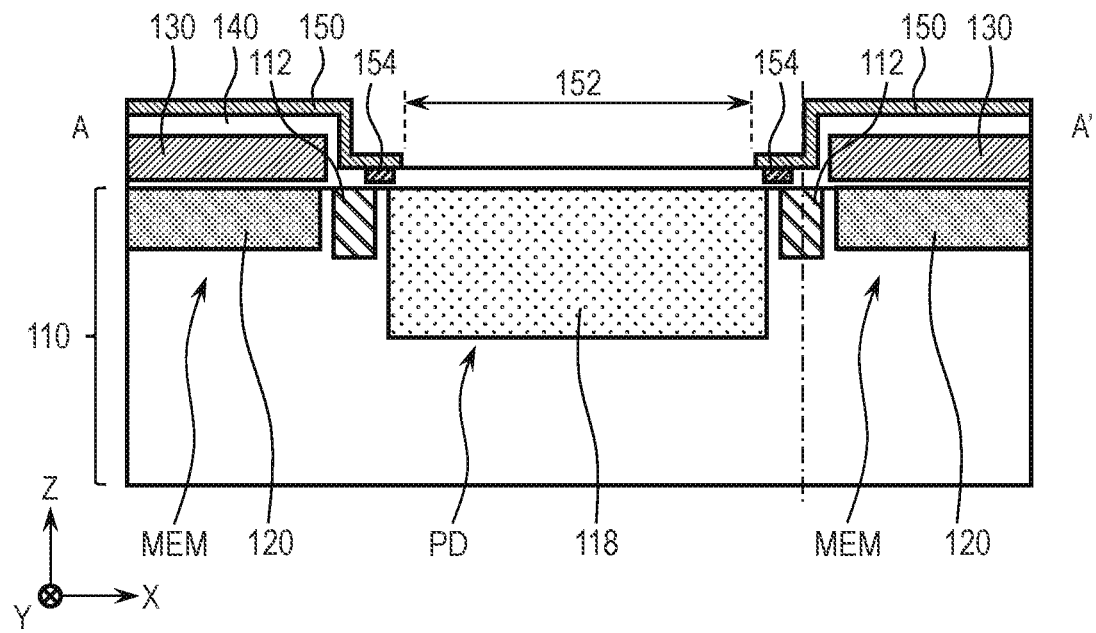
FIG. 11A and FIG. 11B are cross-sectional views of the pixels of the photoelectric conversion device according to the fourth embodiment of the present invention.
Figure 11B:
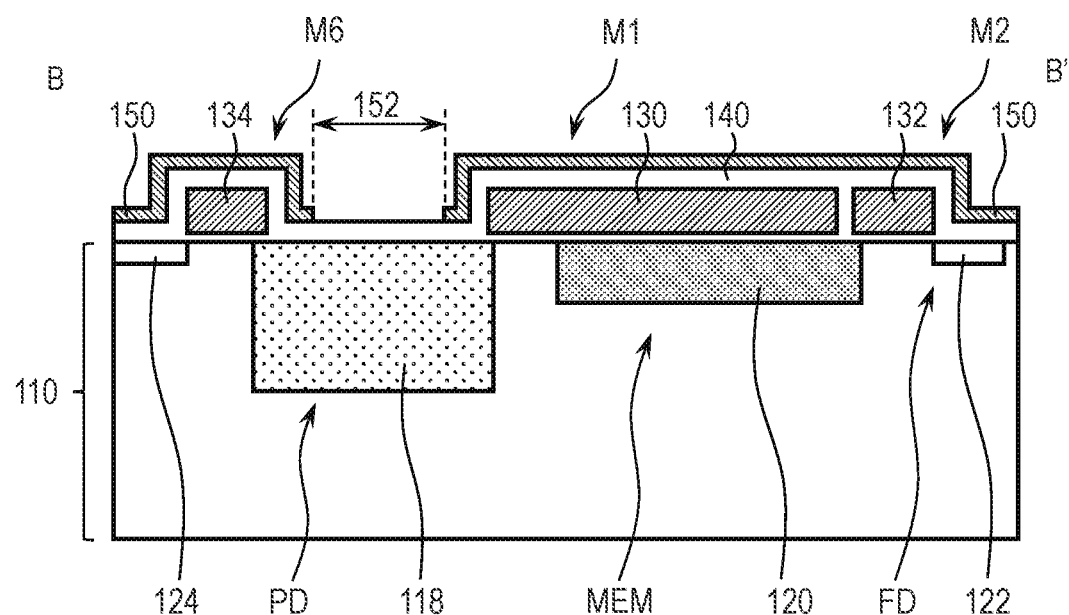

A photoelectric conversion device according to a fourth embodiment of the present invention will be described with reference to FIG. 9 to FIG. 11B. FIG. 9 is an equivalent circuit diagram of a pixel of the photoelectric conversion device according to the present embodiment. FIG. 10 is a plan view of the pixels of the photoelectric conversion device according to the present embodiment. FIG. 11A and FIG. 11B are cross-sectional views of the pixels of the photoelectric conversion device according to the present embodiment. Components similar to those of the photoelectric conversion devices according to the first to third embodiments are denoted by the same reference numerals, and description thereof will be omitted or simplified.

The photoelectric conversion device according to the present embodiment is different from the photoelectric conversion devices according to the first to third embodiments in the configuration of the pixel 12. That is, in the pixel 12 in the photoelectric conversion device of the present embodiment, as illustrated in FIG. 9, the transfer transistor M1 and the charge holding portion MEM in the equivalent circuit of FIG. 2 are integrated. That is, the transfer transistor M1 of the present embodiment has a function as a charge holding portion MEM and a function of transferring the charge of the photoelectric converter PD to the charge holding portion MEM. A part of the gate electrode 130 of the transfer transistor M1 may be an electrode of a MOS capacitor constituting a part of the charge holding portion MEM.

FIG. 10 illustrates an example of a planar layout of the pixels 12. FIG. 11A is a cross-sectional view taken along line A-A' of FIG. 10, and FIG. 11B is a cross-sectional view taken along line B-B' of FIG. 10. The two-dot chain line illustrated in FIG. 10 and FIG. 11A represents a boundary between adjacent pixels 12. The gate electrode 130 of the transfer transistor M1 extends over the n-type semiconductor region 120 serving as the charge holding portion MEM. Since the gate electrode 130 of the transfer transistor M1 extends over the charge holding portion MEM, the light shielding portion 150 is disposed not immediately above the charge holding portion MEM but across the gate electrode 130. Even in this arrangement, the light shielding portion 150 may shield light incident in the direction of the charge holding portion MEM, as in the first to third embodiments. The light shielding portion 112 may be disposed at the same position as in the first to third embodiments regardless of the arrangement of the gate electrode 130. The light shielding portion 154 is for preventing light incident from the opening 152 from being reflected by the surface of the semiconductor substrate 110, propagating through the insulating film 140, and entering the charge holding portion MEM, and is preferably disposed over the semiconductor substrate 110 without separating the transfer transistor M1.

Even in the configuration of the present embodiment in which the transfer transistor M1 and the charge holding portion MEM are integrated as described above, since the light incident in the direction of the charge holding portion MEM may be blocked as in the first to third embodiments, deterioration of the image quality due to the false signal can be prevented.

Thus, according to the present embodiment, it is possible to further reduce the light incident in the direction from the photoelectric converter PD side to the charge holding portion MEM side. Thereby, generation of charge that causes a false signal in the charge holding portion MEM may be reduced, and degradation of image quality may be reduced.

Fifth Embodiment

Figure 12:
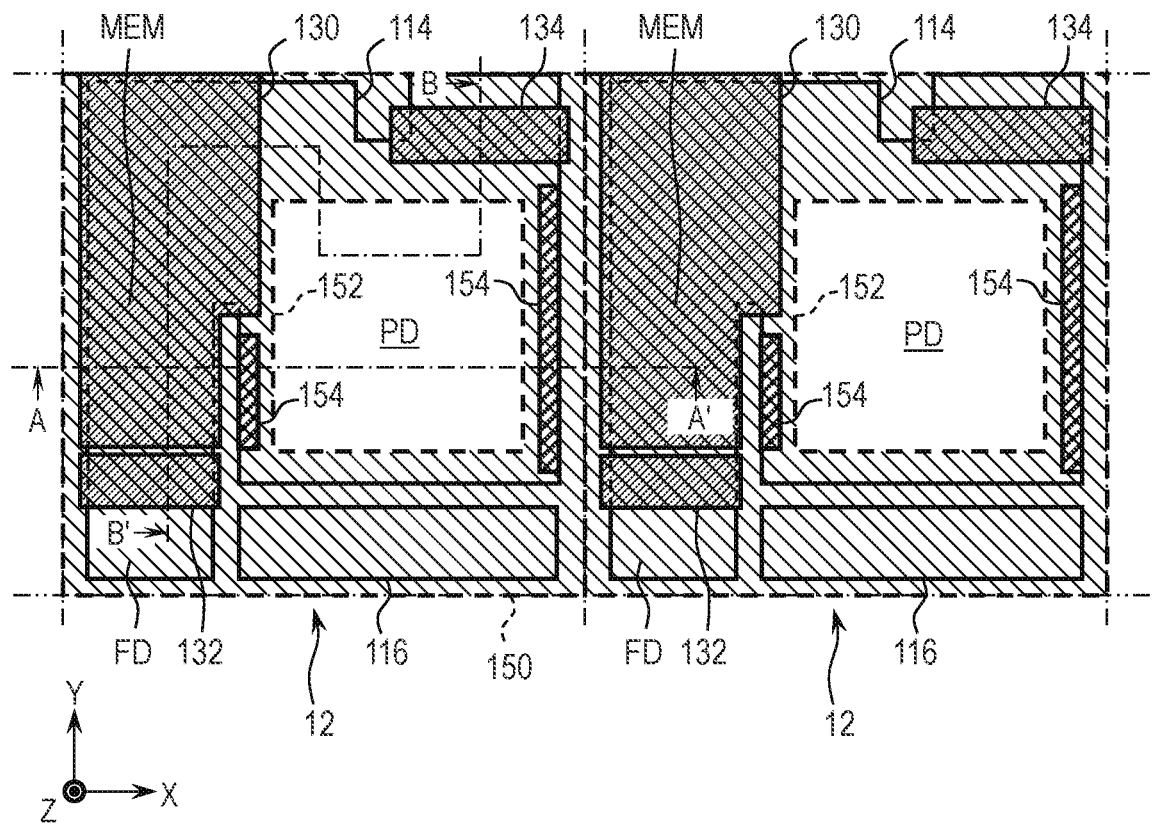
FIG. 12 is a plan view of pixels of a photoelectric conversion device according to a fifth embodiment of the present invention.
Figure 13:
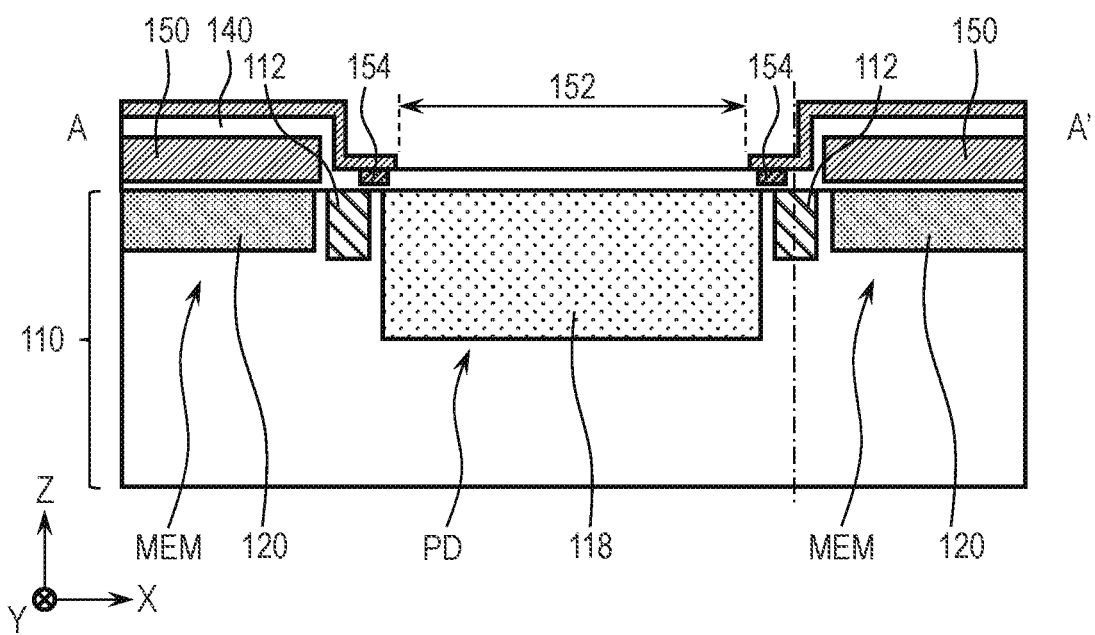
FIG. 13 is a cross-sectional view of the pixels of the photoelectric conversion device according to the fifth embodiment of the present invention.

A photoelectric conversion device according to a fifth embodiment of the present invention will be described with reference to FIG. 12 and FIG. 13. FIG. 12 is a plan view of pixels of the photoelectric conversion device according to the present embodiment. FIG. 13 is a cross-sectional view of a pixel of the photoelectric conversion device according to the present embodiment, and corresponds to a cross-sectional view taken along a line A-A' of FIG. 12. Components similar to those of the photoelectric conversion devices according to the first to fourth embodiments are denoted by the same reference numerals, and description thereof will be omitted or simplified.

The photoelectric conversion device according to the present embodiment is the same as the photoelectric conversion device according to the fourth embodiment except that the planar layout of the transfer transistor M1 is different. That is, in the photoelectric conversion device of the present embodiment, as illustrated in FIG. 12, a part of a transfer path of charge from the photoelectric converter PD to the charge holding portion MEM is disposed between the photoelectric converter PD and the charge holding portion MEM. By configuring the transfer transistor M1 in this manner, the channel width of the transfer transistor M1 is increased, and the charge transfer performance from the photoelectric converter PD to the charge holding portion MEM may be improved.

Even when the transfer transistor M1 is arranged in this manner, the light incident in the direction of the charge holding portion MEM may be blocked by disposing the light shielding portion 154 between the photoelectric converter PD and the charge holding portion MEM other than the transfer path.

Thus, according to the present embodiment, it is possible to further reduce the light incident in the direction from the photoelectric converter PD side to the charge holding portion MEM side. Thereby, generation of charge that causes a false signal in the charge holding portion MEM may be reduced, and degradation of image quality may be reduced.

Sixth Embodiment

Figure 14:
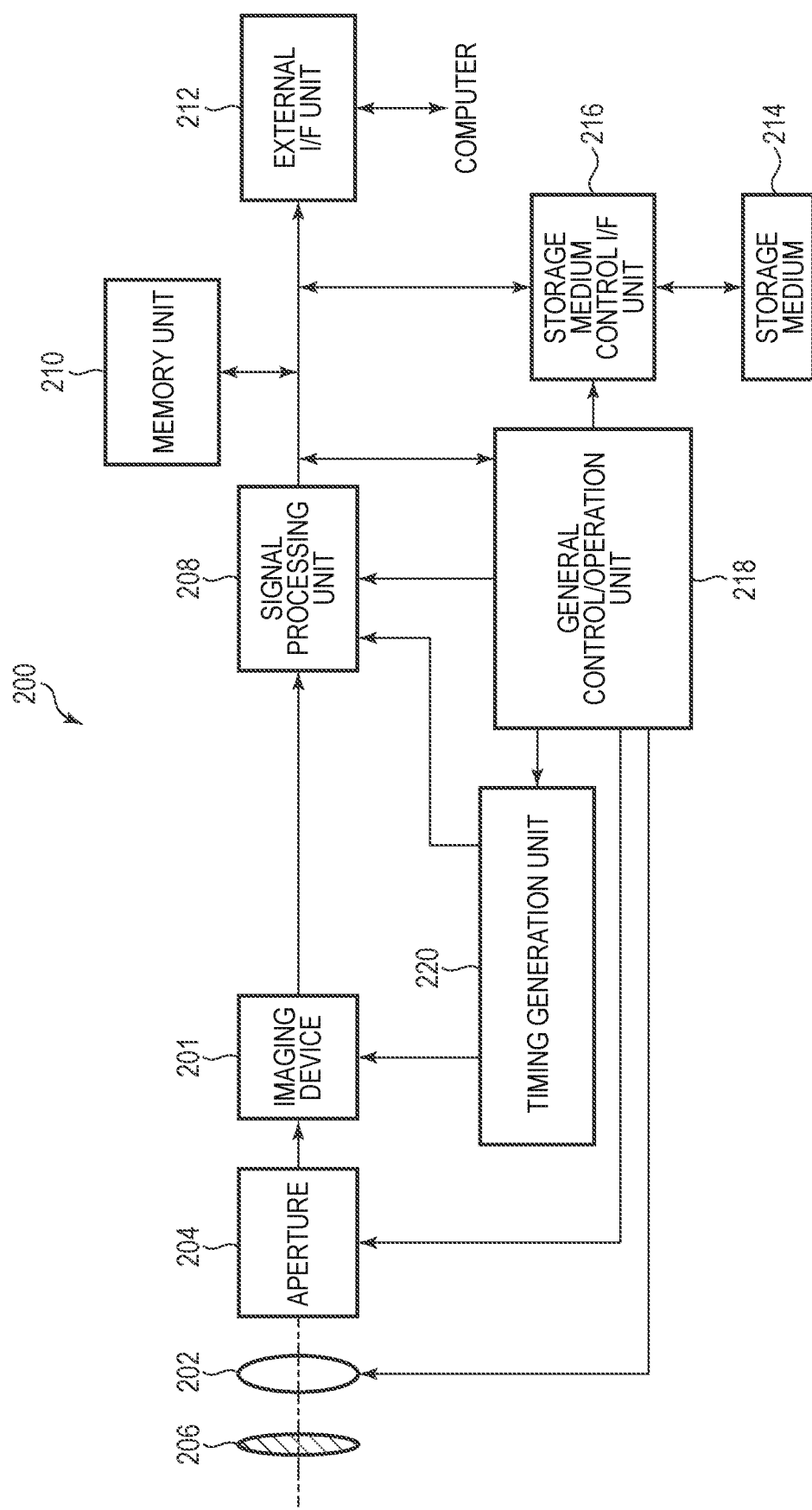
FIG. 14 is a block diagram illustrating a schematic configuration of an imaging system according to a sixth embodiment of the present invention.

An imaging system according to a sixth embodiment of the present invention will be described with reference to FIG. 14. FIG. 14 is a block diagram illustrating a schematic configuration of the imaging system according to the present embodiment.

The photoelectric conversion device 100 described in the first to fifth embodiments may be applied to various imaging systems. Examples of applicable imaging systems include digital still cameras, digital camcorders, surveillance cameras, copying machines, facsimiles, mobile phones, on-vehicle cameras, observation satellites, and the like. A camera module including an optical system such as a lens and an imaging device is also included in the imaging system. FIG. 14 is a block diagram of a digital still camera as an example of these.

The imaging system 200 illustrated in FIG. 14 includes an imaging device 201, a lens 202 for forming an optical image of an object on the imaging device 201, an aperture 204 for varying the amount of light passing through the lens 202, and a barrier 206 for protecting the lens 202. The lens 202 and the aperture 204 form an optical system that collect light on the imaging device 201. The imaging device 201 is the photoelectric conversion device 100 described in any of the first to fifth embodiments, and converts an optical image formed by the lens 202 into image data.

The imaging system 200 also includes a signal processing unit 208 that processes an output signal output from the imaging device 201. The signal processing unit 208 generates image data from a digital signal output from the imaging device 201. The signal processing unit 208 performs various corrections and compressions as necessary and outputs the processed image data. The imaging device 201 may include an AD conversion unit that generates a digital signal to be processed by the signal processing unit 208. The AD conversion unit may be formed in a semiconductor layer (semiconductor substrate) in which the photoelectric converter of the imaging device 201 is formed, or may be formed in a semiconductor substrate different from the semiconductor layer in which the photoelectric converter of the imaging device 201 is formed. The signal processing unit 208 may be formed on the same semiconductor substrate as the imaging device 201.

The imaging system 200 further includes a memory unit 210 for temporarily storing image data, and an external interface unit (external I/F unit) 212 for communicating with an external computer or the like. Further, the imaging system 200 includes a storage medium 214 such as a semiconductor memory for storing or reading out the imaging data, and a storage medium control interface unit (storage medium control I/F unit) 216 for storing or reading out the imaging data on or from the storage medium 214. The storage medium 214 may be built in the imaging system 200, or may be detachable.

The imaging system 200 further includes a general control/operation unit 218 that controls various calculations and operations of the entire digital still camera, and a timing generation unit 220 that outputs various timing signals to the imaging device 201 and the signal processing unit 208.

Here, the timing signal or the like may be input from the outside, and the imaging system 200 may include at least the imaging device 201 and a signal processing unit 208 that processes an output signal output from the imaging device 201.

The imaging device 201 outputs the imaging signal to the signal processing unit 208. The signal processing unit 208 performs predetermined signal processing on the imaging signal output from the imaging device 201, and outputs image data. The signal processing unit 208 generates an image using the imaging signal.

As described above, according to the present embodiment, it is possible to realize an imaging system to which the photoelectric conversion device 100 according to the first to fifth embodiments is applied.

Seventh Embodiment

Figure 15A:
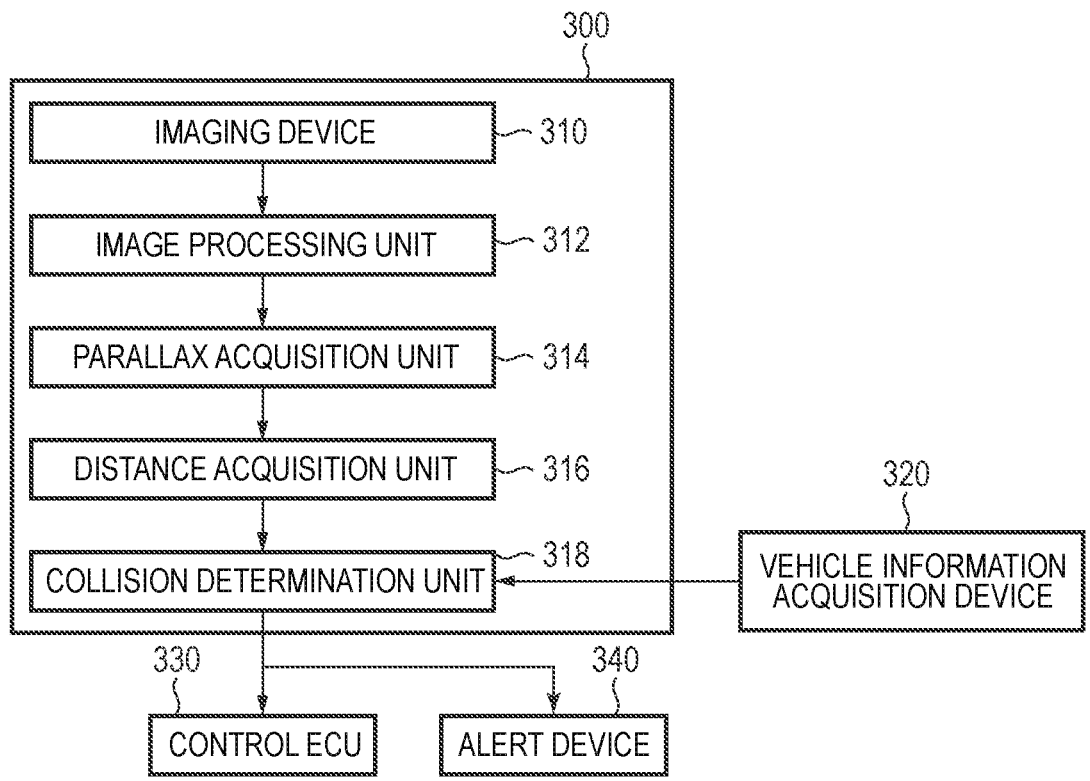
FIG. 15A is a diagram illustrating a configuration example of an imaging system according to a seventh embodiment of the present invention.
Figure 15B:
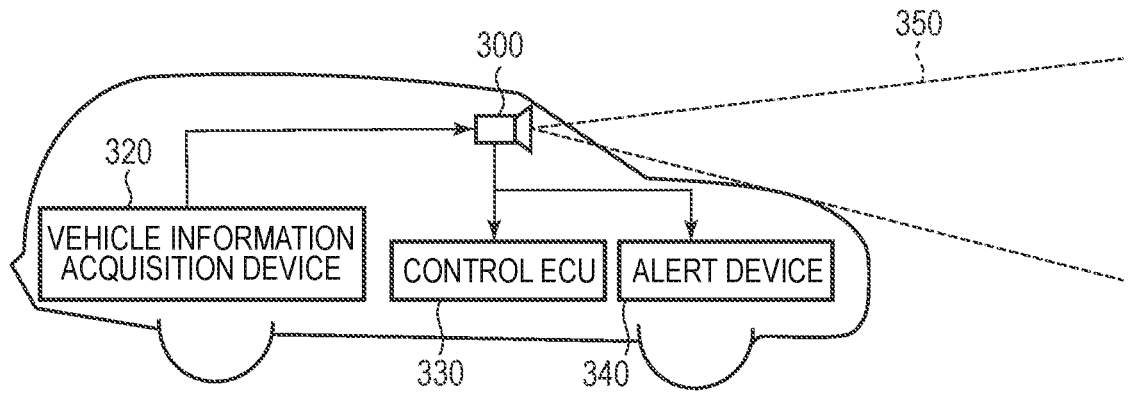
FIG. 15B is a diagram illustrating a configuration example of a movable object according to the seventh embodiment of the present invention.

An imaging system and a movable object according to a seventh embodiment of the present invention will be described with reference to FIG. 15A and FIG. 15B. FIG. 15A is a diagram illustrating a configuration of the imaging system according to the present embodiment. FIG. 15B is a diagram illustrating a configuration of the movable object according to the present embodiment.

FIG. 15A illustrates an example of an imaging system relating to an on-vehicle camera. The imaging system 300 includes an imaging device 310. The imaging device 310 is the photoelectric conversion device 100 described in any one of the first to fifth embodiments. The imaging system 300 includes an image processing unit 312 that performs image processing on a plurality of image data acquired by the imaging device 310, and a parallax acquisition unit 314 that calculates parallax (phase difference of parallax images) from the plurality of image data acquired by the imaging device 310. The imaging system 300 includes a distance acquisition unit 316 that calculates a distance to an object based on the calculated parallax, and a collision determination unit 318 that determines whether or not there is a possibility of collision based on the calculated distance. Here, the parallax acquisition unit 314 and the distance acquisition unit 316 are examples of a distance information acquisition unit that acquires distance information to the object. That is, the distance information may be information on a parallax, a defocus amount, a distance to the object, and the like. The collision determination unit 318 may determine the collision possibility using any of these pieces of distance information. The distance information obtaining unit may be implemented by dedicated hardware or software modules. Further, it may be implemented by FPGA (Field Programmable Gate Array), ASIC (Application Specific Integrated circuit), or the like, or may be implemented by a combination of these.

The imaging system 300 is connected to a vehicle information acquisition device 320, and may acquire vehicle information such as a vehicle speed, a yaw rate, and a steering angle. Further, the imaging system 300 is connected to a control ECU 330 which is a control device that outputs a control signal for generating a braking force to the vehicle based on the determination result of the collision determination unit 318. The imaging system 300 is also connected to an alert device 340 that issues an alert to the driver based on the determination result of the collision determination unit 318. For example, when the collision possibility is high as the determination result of the collision determination unit 318, the control ECU 330 performs vehicle control to avoid collision and reduce damage by braking, returning an accelerator, suppressing engine output, or the like. The alert device 340 alerts a user by sounding an alarm such as a sound, displaying alert information on a screen of a car navigation system or the like, or giving vibration to a seat belt or a steering wheel.

In the present embodiment, the imaging system 300 images the periphery of the vehicle, for example, the front or the rear. FIG. 15B illustrates an imaging system in the case of imaging an image in front of a vehicle (an imaging range 350). The vehicle information acquisition device 320 sends an instruction to the imaging system 300 or the imaging device 310. With such a configuration, the accuracy of distance measurement may be further improved.

In the above description, an example has been described in which control is performed so as not to collide with other vehicles, but the present invention is also applicable to control of automatic driving following other vehicles, control of automatic driving so as not to go out of a lane, and the like. Further, the imaging system is not limited to a vehicle such as a host vehicle, and may be applied to, for example, a movable object (moving device) such as a ship, an aircraft, or an industrial robot. In addition, the present invention may be applied not only to a movable object but also to a wide variety of equipment such as an intelligent transport system (ITS).

Eighth Embodiment

Figure 16:
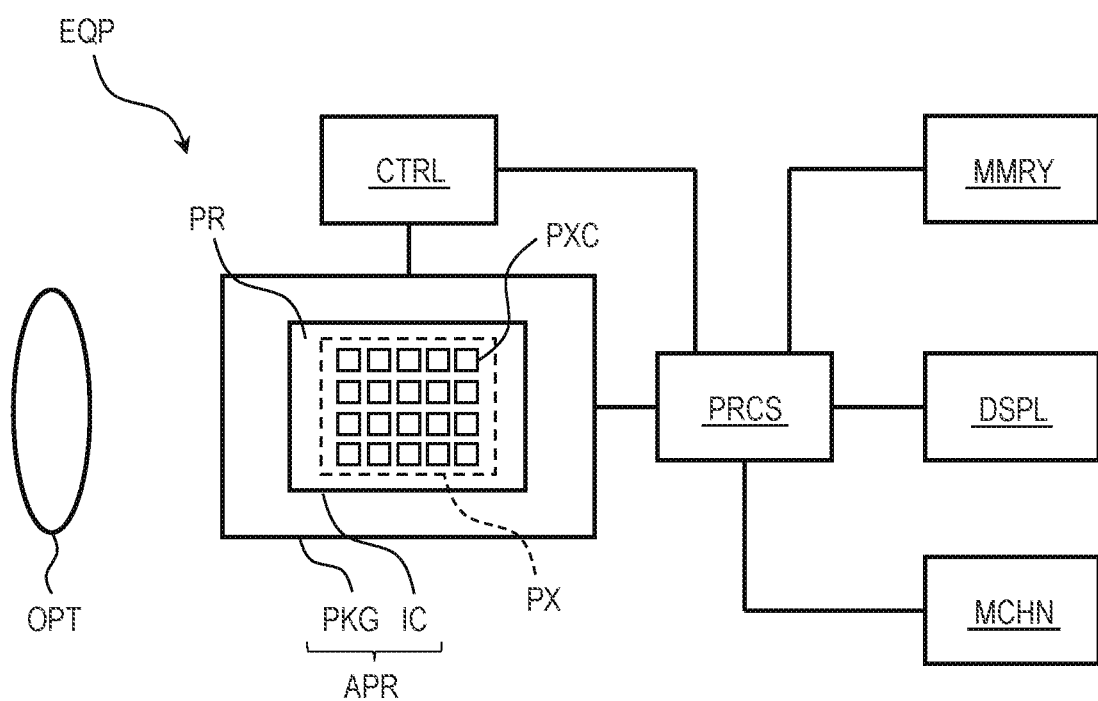
FIG. 16 is a block diagram illustrating a schematic configuration of equipment according to an eighth embodiment of the present invention.

Equipment according to an eighth embodiment of the present invention will be described with reference to FIG. 16. FIG. 16 is a block diagram illustrating a schematic configuration of equipment according to the present embodiment.

FIG. 16 is a schematic diagram illustrating equipment EQP including the photoelectric conversion device APR. The photoelectric conversion device APR has the function of the photoelectric conversion device 100 of any one of the first to fifth embodiments. All or a part of the photoelectric conversion device APR is a semiconductor device IC. The photoelectric conversion device APR of this example may be used, for example, as an image sensor, an AF (Auto Focus) sensor, a photometry sensor, or a distance measurement sensor. The semiconductor device IC includes a pixel area PX in which pixel circuits PXC including photoelectric converters are arranged in a matrix. The semiconductor device IC may include a peripheral area PR around the pixel area PX. Circuits other than the pixel circuits may be arranged in the peripheral area PR.

The photoelectric conversion device APR may have a structure (chip stacked structure) in which a first semiconductor chip provided with a plurality of photoelectric converters and a second semiconductor chip provided with peripheral circuits are stacked. Each peripheral circuit in the second semiconductor chip may be a column circuit corresponding to a pixel column of the first semiconductor chip. The peripheral circuits in the second semiconductor chip may be matrix circuits corresponding to the pixels or the pixel blocks of the first semiconductor chip. As a connection between the first semiconductor chip and the second semiconductor chip, a through electrode (TSV), an inter-chip interconnection by direct bonding of a conductor such as copper, a connection by micro bumps between chips, a connection by wire bonding, or the like may be adopted.

In addition to the semiconductor device IC, the photoelectric conversion device APR may include a package PKG that accommodates the semiconductor device IC. The package PKG may include a base body to which the semiconductor device IC is fixed, a lid body made of glass or the like facing the semiconductor device IC, and a connection member such as a bonding wire or a bump that connects terminals provided on the base body to terminals provided on the semiconductor device IC.

The equipment EQP may further comprise at least one of an optical device OPT, a control device CTRL, a processing device PRCS, a display device DSPL, a storage device MMRY, and a mechanical device MCHN. The optical device OPT corresponds to the photoelectric conversion device APR as a photoelectric conversion device, and is, for example, a lens, a shutter, or a mirror. The control device CTRL controls the photoelectric conversion device APR, and is, for example, a semiconductor device such as an ASIC (Application Specific Integrated Circuit). The processing device PRCS processes a signal output from the photoelectric conversion device APR, and constitutes an AFE (analog front end) or a DFE (digital front end). The processing unit PRCS is a semiconductor device such as a central processing unit (CPU) or an ASIC. The display device DSPL may be an EL display device or a liquid crystal display device which displays information (image) obtained by the photoelectric conversion device APR. The storage device MMRY may be a magnetic device or a semiconductor device that stores information (images) obtained by the photoelectric conversion device APR. The storage device MMRY may be a volatile memory such as an SRAM or a DRAM, or a nonvolatile memory such as a flash memory or a hard disk drive. The mechanical device MCHN includes a movable portion or a propulsion portion such as a motor or an engine. In the equipment EQP, a signal output from the photoelectric conversion device APR is displayed on the display device DSPL, and is transmitted to the outside by a communication device (not illustrated) included in the equipment EQP. Therefore, it is preferable that the equipment EQP further includes a storage device MMRY and a processing device PRCS separately from the storage circuit unit and the arithmetic circuit unit included in the photoelectric conversion device APR.

The equipment EQP illustrated in FIG. 16 may be an electronic device such as an information terminal (for example, a smartphone or a wearable terminal) having a photographing function or a camera (For example, an interchangeable lens camera, a compact camera, a video camera, and a surveillance camera). The mechanical device MCHN in the camera may drive components of the optical device OPT for zooming, focusing, and shutter operation. The equipment EQP may be a transportation device (movable object) such as a vehicle, a ship, or an airplane. The equipment EQP may be a medical device such as an endoscope or a CT scanner.

The mechanical device MCHN in the transport device may be used as a mobile device. The equipment EQP as a transport device is suitable for transporting the photoelectric conversion device APR, or for assisting and/or automating operation (manipulation) by an imaging function. The processing device PRCS for assisting and/or automating operation (manipulation) may perform processing for operating the mechanical device MCHN as a mobile device based on information obtained by the photoelectric conversion device APR.

The photoelectric conversion device APR according to the present embodiment may provide the designer, the manufacturer, the seller, the purchaser, and/or the user with high value. Therefore, when the photoelectric conversion device APR is mounted on the equipment EQP, the value of the equipment EQP may be increased. Therefore, in order to increase the value of the equipment EQP, it is advantageous to determine the mounting of the photoelectric conversion device APR of the present embodiment on the equipment EQP when the equipment EQP is manufactured and sold.

Modified Embodiments

The present invention is not limited to the above embodiment, and various modifications are possible.

For example, an example in which some of the configurations of any of the embodiments are added to other embodiments or an example in which some of the configurations of the other embodiments are substituted is also an embodiment of the present invention.

Further, in the third embodiment, although the light shielding portion 112 and the light shielding portion 154 are provided in addition to the light shielding portion 150, only the light shielding portion 154 may be provided without providing the light shielding portion 112. Also in this case, light incident in a direction from the photoelectric converter PD side to the charge holding portion MEM side may be reduced as compared with a case where the light shielding portions 112 and 154 are not provided.

Further, in the fourth and fifth embodiments, although the light shielding portion 112 and the light shielding portion 154 are provided in addition to the light shielding portion 150, only one of the light shielding portion 112 and the light shielding portion 154 may be provide. Also in this case, light incident in a direction from the photoelectric converter PD side to the charge holding portion MEM side may be reduced as compared with a case where the light shielding portions 112 and 154 are not provided.

Although the photoelectric converter PD having the n-type semiconductor region 118 and the charge holding portion MEM having the n-type semiconductor region 120 are illustrated in the first to fifth embodiments, the photoelectric converter PD and the charge holding portion MEM may have a buried diode structure. In this case, the photoelectric converter PD may further include a p-type semiconductor region on the surface side of the semiconductor substrate 110 with respect to the n-type semiconductor region 118. The charge holding portion MEM may further include a p-type semiconductor region on the surface side of the semiconductor substrate 110 with respect to the n-type semiconductor region 120.

The imaging systems described in the sixth and seventh embodiments are examples of imaging systems to which the photoelectric conversion device of the present invention may be applied, and imaging systems to which the photoelectric conversion device of the present invention may be applied are not limited to the configurations illustrated in FIG. 14 and FIG. 16.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-128520, filed Aug. 4, 2021 which is hereby incorporated by reference herein in its entirety.

What is claimed is:

1. A photoelectric conversion device comprising:
a substrate provided with pixels each including a photoelectric converter that accumulates a charge generated by an incidence of light, a charge holding portion that holds the charge transferred from the photoelectric converter, and an amplifier unit that includes a transistor having a gate that receives the charge transferred from the charge holding portion;
a metal film disposed above a first surface of the substrate so as to cover at least the charge holding portion; and
a trench structure disposed in the substrate and extending from the first surface,
wherein the photoelectric conversion device is configured such that the light is incident from a side of the first surface of the substrate,
wherein the gate is disposed above the first surface, and
wherein the trench structure is disposed between the photoelectric converter and the charge holding portion of a first pixel.

2. The photoelectric conversion device according to claim 1, wherein the photoelectric converter and the charge holding portion of the first pixel are arranged in a first direction in a top view from a direction perpendicular to the first surface of the substrate.

3. The photoelectric conversion device according to claim 1, wherein the trench structure is further disposed between the photoelectric converter of a second pixel adjacent to the first pixel and the charge holding portion of the first pixel.

4. The photoelectric conversion device according to claim 3, wherein the photoelectric converter of the second pixel and the charge holding portion of the first pixel are arranged in a first direction in a top view from a direction perpendicular to the first surface of the substrate.

5. The photoelectric conversion device according to claim 2,
wherein the first pixel further includes a transfer transistor configured to transfer the charge held in the photoelectric converter to the charge holding portion, and
wherein a gate electrode of the transfer transistor is arranged in a second direction intersecting the first direction with respect to the charge holding portion of the first pixel.

6. The photoelectric conversion device according to claim 1,
wherein the first pixel further includes a transfer transistor configured to transfer the charge held in the photoelectric converter to the charge holding portion, and
wherein a gate electrode of the transfer transistor extends in a region overlapping with the charge holding portion of the first pixel in a top view from a direction perpendicular to the first surface of the substrate.

7. The photoelectric conversion device according to claim 1,
wherein the trench structure is arranged in a region between the photoelectric converter and the charge holding portion of the first pixel except a transfer path through which the charge is transferred from the photoelectric converter to the charge holding portion, and
wherein the transfer path is disposed between the first surface and a bottom of the photoelectric converter.

8. The photoelectric conversion device according to claim 1,
wherein the metal film has an opening in a portion overlapping with the photoelectric converter of the first pixel in a top view from a direction perpendicular to the first surface of the substrate, and
wherein a transfer path through which the charge is transferred from the photoelectric converter to the charge holding portion of the first pixel is arranged on a side of the opening in a second direction intersecting a first direction in which the photoelectric converter and the charge holding portion of the first pixel are arranged.

9. The photoelectric conversion device according to claim 1, wherein the trench structure is provided from the first surface of the substrate to a portion deeper than the charge holding portion of the first pixel.

10. The photoelectric conversion device according to claim 1 further comprising a metal member disposed between the first surface and the metal film in a portion overlapping a region between the photoelectric converter and the charge holding portion of the first pixel in a top view of the substrate in a direction perpendicular to the first surface.

11. The photoelectric conversion device according to claim 10, wherein the metal member is in contact with the first surface of the substrate.

12. The photoelectric conversion device according to claim 10 further comprising an insulating film disposed between the metal member and the first surface of the substrate.

13. The photoelectric conversion device according to claim 1, wherein the trench structure includes an insulating material or a metal material.

14. The photoelectric conversion device according to claim 1, wherein the trench structure is configured such that an amount of light incident on the charge holding portion of the first pixel from a side of the photoelectric converter of the first pixel is smaller than that in a case where the trench structure is not provided.

15. A photoelectric conversion device comprising:
a substrate provided with pixels each including a photoelectric converter that accumulates a charge generated by an incidence of light, a charge holding portion that holds the charge transferred from the photoelectric converter, and an amplifier unit that includes a transistor having a gate that receives the charge transferred from the charge holding portion;

a first light shielding portion disposed above a first surface of the substrate so as to cover at least the charge holding portion; and a second light shielding portion provided in the substrate and including a portion disposed at a depth position between the first surface and a bottom of the photoelectric converter, wherein the photoelectric conversion device is configured such that the light is incident from a side of the first surface of the substrate, wherein the gate is disposed above the first surface, and, wherein the second light shielding portion is arranged between the photoelectric converter and the charge holding portion of a first pixel.

16. The photoelectric conversion device according to claim 15, wherein the second light shielding portion is arranged in a region between the photoelectric converter and the charge holding portion of the first pixel except a transfer path through which the charge is transferred from the photoelectric converter to the charge holding portion, and wherein the transfer path is disposed between the first surface and the bottom of the photoelectric converter.

17. The photoelectric conversion device according to claim 15 further comprising a third light shielding portion provided in the substrate and including a portion disposed at a depth position between the first surface and the bottom of the photoelectric converter, wherein the third light shielding portion is arranged between the photoelectric converter of a second pixel adjacent to the first pixel and the charge holding portion of the first pixel.

18. An imaging system comprising:

the photoelectric conversion device according to claim 1; and a signal processing unit that processes a signal output from the photoelectric conversion device.

19. A movable object comprising:

the photoelectric conversion device according to claim 1;

a distance information acquiring unit configured to acquire distance information to an object from a parallax image based on a signal from the photoelectric conversion device; and a control unit configured to control the movable object based on the distance information.

20. Equipment comprising:

the photoelectric conversion device according to claim 1, and at least one of an optical device corresponding to the photoelectric conversion device, a control device configured to control the photoelectric conversion device, a processing device configured to process a signal output from the photoelectric conversion device, a mechanical device that is controlled based on information obtained by the photoelectric conversion device, a display device configured to display information obtained by the photoelectric conversion device, and a storage device configured to store information obtained by the photoelectric conversion device.

* * * * *